US011626449B2

United States Patent
Okabe et al.

(10) Patent No.: US 11,626,449 B2
(45) Date of Patent: Apr. 11, 2023

(54) DISPLAY DEVICE AND METHOD FOR PRODUCING DISPLAY DEVICE

(71) Applicant: SHARP KABUSHIKI KAISHA, Sakai (JP)

(72) Inventors: Tohru Okabe, Sakai (JP); Ryosuke Gunji, Sakai (JP); Shinsuke Saida, Sakai (JP); Shinji Ichikawa, Sakai (JP); Kohji Ariga, Sakai (JP); Hiroki Taniyama, Sakai (JP); Yoshihiro Nakada, Yonago (JP); Koji Tanimura, Yonago (JP); Yoshihiro Kohara, Yonago (JP); Hiroharu Jinmura, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 135 days.

(21) Appl. No.: 17/040,399

(22) PCT Filed: Mar. 22, 2018

(86) PCT No.: PCT/JP2018/011421
§ 371 (c)(1),
(2) Date: Sep. 22, 2020

(87) PCT Pub. No.: WO2019/180878
PCT Pub. Date: Sep. 26, 2019

(65) Prior Publication Data
US 2021/0020689 A1  Jan. 21, 2021

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/56* (2013.01);
(Continued)

(58) Field of Classification Search
CPC ..... H01L 27/156; H01L 33/005; H01L 33/56; H01L 33/62; H01L 2933/005;
(Continued)

(56) References Cited

U.S. PATENT DOCUMENTS

2005/0170548 A1  8/2005  Yoon et al.
2007/0048910 A1  3/2007  Yoon et al.
(Continued)

FOREIGN PATENT DOCUMENTS

JP   2005-521919 A   7/2005
JP   2005-331665 A   12/2005
(Continued)

*Primary Examiner* — S M Sohel Imtiaz
(74) *Attorney, Agent, or Firm* — ScienBiziP, P.C.

(57) ABSTRACT

In a display device, an inorganic insulating layer, a metal layer, a flattering film, a first electrode, an edge cover, a function layer, and a second electrode are formed, in that order, on a base substrate. The edge cover covers an edge of the first electrode and includes a first opening exposing the first electrode. The function layer is formed covering the first opening and an edge of the edge cover. The flattening film includes a first planar portion and a second planar portion having a film thickness smaller than that of the first planar portion, is configured to electrically connect the first electrode and the metal layer via a contact hole formed in the first planar portion, and overlaps the first opening of the edge cover at at least a portion of the second planar portion.

2 Claims, 8 Drawing Sheets

(51) Int. Cl.
*H01L 33/56* (2010.01)
*H01L 33/62* (2010.01)
*H05K 1/18* (2006.01)

(52) U.S. Cl.
CPC ............. *H01L 33/62* (2013.01); *H05K 1/189* (2013.01); *H01L 2933/005* (2013.01); *H05K 2201/10128* (2013.01)

(58) Field of Classification Search
CPC ............. H01L 27/3216; H01L 51/5246; H01L 27/3246; H01L 27/3258; H01L 27/3262; H05K 1/189; H05K 2201/10128
See application file for complete search history.

(56) References Cited

U.S. PATENT DOCUMENTS

2014/0367655 A1* 12/2014 Takii ................... H01L 27/3258
                                                        438/34
2015/0028315 A1* 1/2015 Nishimura .......... H01L 51/5209
                                                        438/46
2015/0206928 A1* 7/2015 Kimura ............... H01L 51/5209
                                                        257/88
2016/0190213 A1   6/2016 Kim et al.
2017/0301769 A1* 10/2017 Nakajima ............. G02F 1/1345
2019/0115560 A1*  4/2019 Kim ..................... H01L 27/3276
2019/0179466 A1*  6/2019 Kim ..................... G09G 3/3291

FOREIGN PATENT DOCUMENTS

| JP | 2005331665 A | * | 12/2005 | ......... H01L 51/5218 |
| JP | 2007-287346 A | | 11/2007 | |
| JP | 2015-046391 A | | 3/2015 | |
| JP | 2015046391 A | * | 3/2015 | |
| JP | 2015-138612 A | | 7/2015 | |
| JP | 2016-127003 A | | 7/2016 | |
| WO | 2013/124916 A1 | | 8/2013 | |

* cited by examiner

DISPLAY DEVICE AND METHOD FOR PRODUCING DISPLAY DEVICE

TECHNICAL FIELD

The disclosure relates to a display device having a high luminous efficiency, and a method for manufacturing the display device.

BACKGROUND ART

PTL 1 discloses a configuration in which an uneven pattern is formed on a flattening film.

CITATION LIST

Patent Literature

PTL 1: JP 2005-521919 A

SUMMARY

Technical Problem

In a known display device, a flattening film has unevenness on a front face due to an effect of a source wiring line or the like formed in a lower layer. An anode is formed on the flattening film having unevenness, and thus the effect of the unevenness makes it less likely for reflected light to be reflected in a straight manner in a light-emitting region. Therefore, in a known display device, the luminous efficiency is suppressed due to a reduction in reflectivity.

The disclosure has been made in view of the problems described above, and an object thereof is to realize a display device having a high luminous efficiency and a method for manufacturing the display device.

Solution to Problem

A display device according to the disclosure for solving the problems described above includes a base substrate, an inorganic insulating layer, a metal layer, a flattening film, a first electrode, an edge cover, a function layer, and a second electrode. The inorganic insulating layer, the metal layer, the flattening film, the first electrode, the edge cover, the function layer, and the second electrode are formed, in that order, on the base substrate. The edge cover covers an edge of the first electrode and includes a first opening exposing the first electrode. The function layer is formed covering the first opening and an edge of the edge cover. The flattening film includes a first planar portion and a second planar portion having a film thickness smaller than that of the first planar portion, is configured to electrically connect the first electrode and the metal layer via a contact hole formed in the first planar portion, and overlaps the first opening at at least a portion of the second planar portion.

Further, a method for manufacturing a display device according to the disclosurefor solving the problems described above is a method for manufacturing a display device including a base substrate, an inorganic insulating layer, a metal layer, a flattening film, a first electrode, an edge cover, a function layer, and a second electrode, the inorganic insulating layer, the metal layer, the flattening film, the first electrode, the edge cover, the function layer, and the second electrode being formed, in that order, on the base substrate, the edge cover covering an edge of the first electrode and including a first opening exposing the first electrode, and the function layer being formed covering the first opening and an edge of the edge cover. The method includes the steps of forming the flattening film, applying a flattening resin onto the inorganic insulating layer and an upper layer of the metal layer, and using a graytone mask or a halftone mask to form a first planar portion including a contact hole configured to expose, all at once, the flattening resin and expose the metal layer, and a second planar portion having a film thickness smaller than that of the first planar portion and overlapping, at at least a portion thereof, the first opening.

According to the configuration described above, a reflected light reflected by the first electrode formed in the second planar portion is readily reflected in a straight manner. With the second planar portion overlapping, at at least a portion thereof, the first opening, it is possible to realize a display device having a luminous efficiency higher than that in the past.

Advantageous Effects of Disclosure

According to an aspect of the disclosure, a reflectivity of a light-emitting element can be improved.

DESCRIPTION OF EMBODIMENTS

In the following, "same layer" means formation in the same process (film formation step). "Lower layer" means that the layer is formed in a process before that of the layer being compared. "Upper layer" means that the layer is formed in a process after that of the layer being compared.

Figure 1:
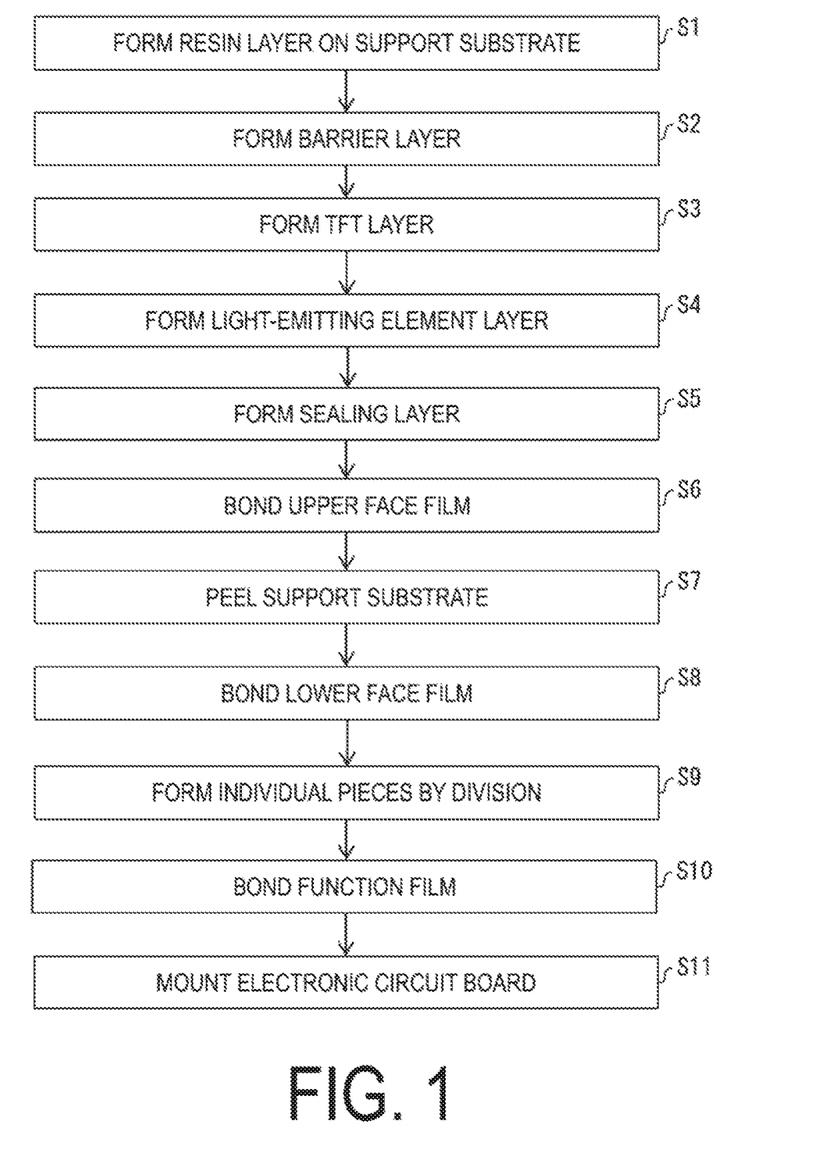
FIG. 1 is a flowchart illustrating an example of a method for manufacturing a display device according to the present embodiment.
Figure 2:
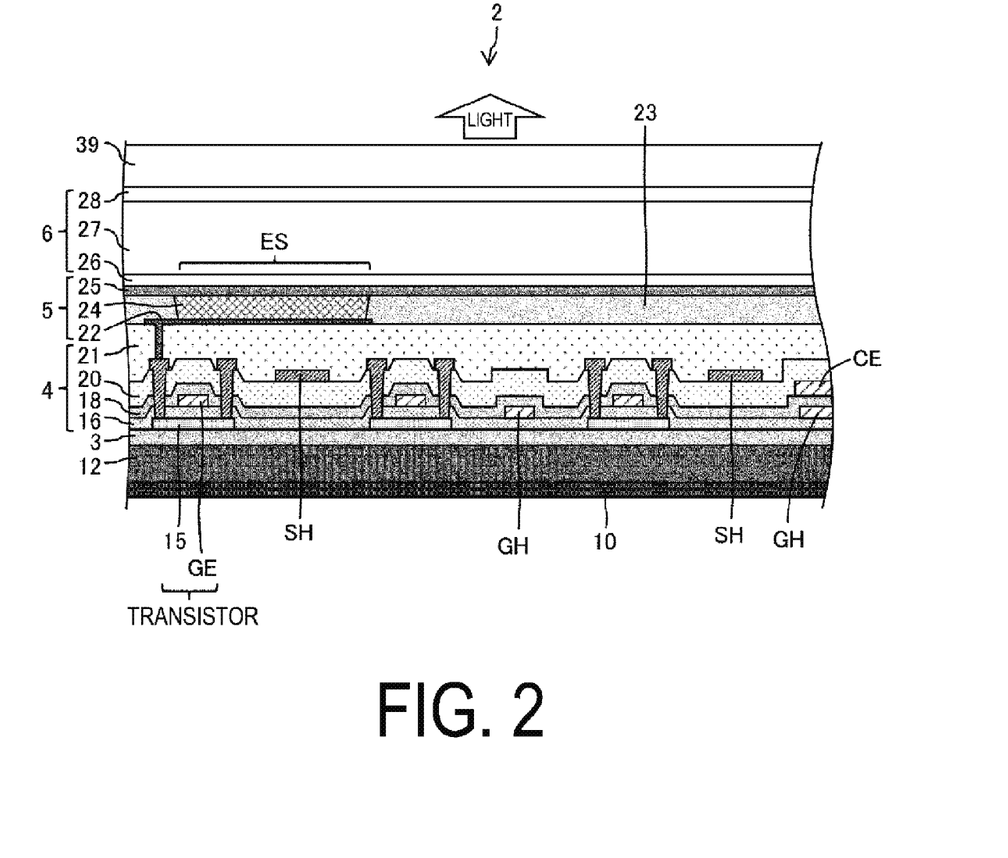
FIG. 2 is a cross-sectional view illustrating a configuration example of a display region of the display device according to the present embodiment.

FIG. 1 is a flowchart illustrating an example of a method for manufacturing a display device. FIG. 2 is a cross-sectional view illustrating a configuration of a display region of the display device.

When a flexible display device is manufactured, as illustrated in FIG. 1 and FIG. 2, first, a resin layer 12 is formed on a support substrate (a mother glass, for example) that is transparent (step S1). Next, a barrier layer 3 is formed (step S2). Next, a thin-film transistor (TFT) layer 4 is formed (step S3). Next, a top-emitting type light-emitting element layer 5 is formed (step S4). Next, a sealing layer 6 is formed (step S5). Next, an upper face film is bonded onto the sealing layer 6 (step S6).

Next, the support substrate is peeled from the resin layer 12 by irradiation of laser light or the like (step S7). Next, a lower face film 10 is bonded to a lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded to the obtained individual pieces (step S10). Next, an electronic circuit board (for example, an integrated circuit (IC) chip and a flexible printed circuit (FPC)) is mounted onto a portion (terminal portion) outside (non-display region, frame) of the display region in which a plurality of subpixels are formed (step S11).

Note that steps S1 to S11 are performed by a display device manufacturing apparatus (including a film formation apparatus configured to perform each process of the steps S1 to S5). Further, the disclosure is not limited to a flexible display device. The base substrate of the display device may be a resin layer, such as a lower face film, or a glass substrate.

Examples of a material of the resin layer 12 include a polyimide or the like. A portion of the resin layer 12 can be replaced with a two-layer resin film (for example, a polyimide film) and an inorganic insulating film interposed therebetween.

The barrier layer 3 is a layer that prevents impurities such as moisture and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD), for example.

The TFT layer 4 includes a semiconductor film 15, an inorganic insulating film 16 (gate insulating film) in an upper layer overlying the semiconductor film 15, a first metal layer (gate electrode GE and gate wiring line GH) in an upper layer overlying the inorganic insulating film 16, an inorganic insulating film 18 in an upper layer overlying the gate electrode GE and the gate wiring line GH, a second metal layer (capacitance electrode CE) in an upper layer overlying the inorganic insulating film 18, an inorganic insulating film 20 in an upper layer overlying the capacitance electrode CE, a third metal layer (source wiring line SH) in an upper layer overlying the inorganic insulating film 20, and a flattening film 21 (interlayer insulating film) in an upper layer overlying the source wiring line SH.

The semiconductor film 15 includes, for example, a low-temperature polysilicon (LTPS) or an oxide semiconductor (for example, an In—Ga—Zn—O based semiconductor), and a transistor (TFT) is configured to include the semiconductor film 15 and the gate electrode GE. While, in FIG. 2, the transistor is illustrated as having a top gate structure, the transistor may have a bottom gate structure.

The gate electrode GE, the gate wiring line GH, the capacitance electrode CE, and the source wiring line SH are each composed of a single layer film or a layered film of a metal including at least one of aluminum, tungsten, molybdenum, tantalum, chromium, titanium, and copper, for example. The TFT layer 4 in FIG. 2 includes a single-layer semiconductor layer and a three-layer metal layer (the first metal layer, the second metal layer, and the third metal layer). The TFT layer 4 may further include a plurality of semiconductor layers and/or metal layers, or the like.

Each of the inorganic insulating films 16, 18, 20 can be formed of, for example, a silicon oxide (SiOx) film or a silicon nitride (SiNx) film, or a layered film of these, formed using CVD. The flattening film 21 can be formed of, for example, a coatable organic material such as a polyimide or an acrylic.

The light-emitting element layer 5 includes an anode 22 in an upper layer overlying the flattening film 21, an edge cover 23 having insulating properties and covering an edge of the anode 22, a light-emitting (electroluminescent; function layer) layer 24 in an upper layer overlying the edge cover 23, and a cathode 25 in an upper layer overlying the light-emitting layer 24. The edge cover 23 is formed by applying an organic material such as a polyimide or an acrylic and then patterning the organic material by photolithography, for example.

On a subpixel-by-subpixel basis, a light-emitting element ES (for example, an organic light-emitting diode (OLED) or a quantum dot light-emitting diode (QLED)) including the anode 22 having an island shape, the light-emitting layer 24, and the cathode 25 is formed in the light-emitting element layer 5, and a subpixel circuit that controls the light-emitting element ES is formed in the TFT layer 4. The edge cover 23 covers the edge of the anode 22 and includes an opening (first opening) exposing the anode 22, and the light-emitting layer 24 is formed covering the opening and an edge of the edge cover 23. The opening of this edge cover 23 serves as a light-emitting region of a pixel.

The light-emitting layer 24 is formed by, for example, layering a hole injection layer, a hole transport layer, a light-emitting layer, an electron transport layer, and an electron injection layer, in this order, from the lower layer side. The light-emitting layer is formed into an island shape at the opening of the edge cover 23 (on a subpixel-by-subpixel basis) by vapor deposition or an ink-jet method. Other layers are formed in an island shape or a solid-like shape (common layer). A configuration is also possible in which one or more layers of the hole injection layer, the hole transport layer, the electron transport layer, and the electron injection layer are not formed.

In a case where the light-emitting layer of the OLED is formed by vapor deposition, a fine metal mask (FMM) is used. The FMM is a sheet (made of an invar material, for example) including a large number of openings, and the light-emitting layer (corresponding to one subpixel) having an island shape is formed by an organic material passed through one of the openings.

The light-emitting layer of the QLED can, for example, form a light-emitting layer (corresponding to one subpixel) having an island shape by applying by ink-jet a solvent having quantum dots diffused therein.

The anode (anode electrode) 22 is formed by a layering of indium tin oxide (ITO) and silver (Ag) or an alloy containing Ag, for example, and has light reflectivity. The cathode (cathode electrode) 25 can be formed by a transparent conductive material such as a MgAg alloy (extremely thin film), ITO, or indium zinc oxide (IZO).

In a case where the light-emitting element ES is an OLED, positive holes and electrons recombine inside the light-emitting layer in response to a drive current between the anode 22 and the cathode 25, and light is emitted as a result of excitons, which are generated by the recombination, falling into a ground state. With the cathode 25 being transparent and the anode 22 being light-reflective, the light emitted from the light-emitting layer 24 travels upwards and results in top emission.

In a case where the light-emitting element ES is a QLED, positive holes and electrons recombine inside the light-emitting layer in response to a drive current between the anode 22 and the cathode 25, and light (fluorescence) is emitted as a result of excitons, which are generated by the recombination, transitioning from a conduction band level to a valence band level of the quantum dots.

A light-emitting element (such as an inorganic light-emitting diode) other than the OLED and the QLED may be formed on the light-emitting element layer 5.

The sealing layer 6 is transparent, and includes an inorganic sealing film 26 for covering the cathode 25, an organic buffer film 27 in an upper layer overlying the inorganic sealing film 26, and an inorganic sealing film 28 in an upper layer overlying the organic buffer film 27. The sealing layer 6 covering the light-emitting element layer 5 prevents foreign matter, such as moisture and oxygen, from penetrating into the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as an acrylic. The organic buffer film 27 can be formed by, for example, an ink-jet application, but a bank for stopping droplets may be provided in the non-display region.

The lower face film 10 is, for example, a polyethylene terephthalate (PET) film for realizing a display device having excellent flexibility by being bonded to a lower face of the resin layer 12 after the support substrate is peeled off. The function film 39 has at least one of an optical compensation function, a touch sensor function, and a protection function, for example.

While the above has described a flexible display device, in the case of manufacturing a non-flexible display device, generally formation of a resin layer, replacement of the substrate, and the like are not required, and thus the layering process of steps S2 to S5 on the glass substrate is performed and subsequently the flow transitions to step S9, for example.

Flattening Film 21

In the above, the configuration of a display device 2 and the method for manufacturing the display device 2 have been described. In the below, details of the flattening film 21 included in the display device 2 will be described with reference to FIG. 3.

Figure 3:
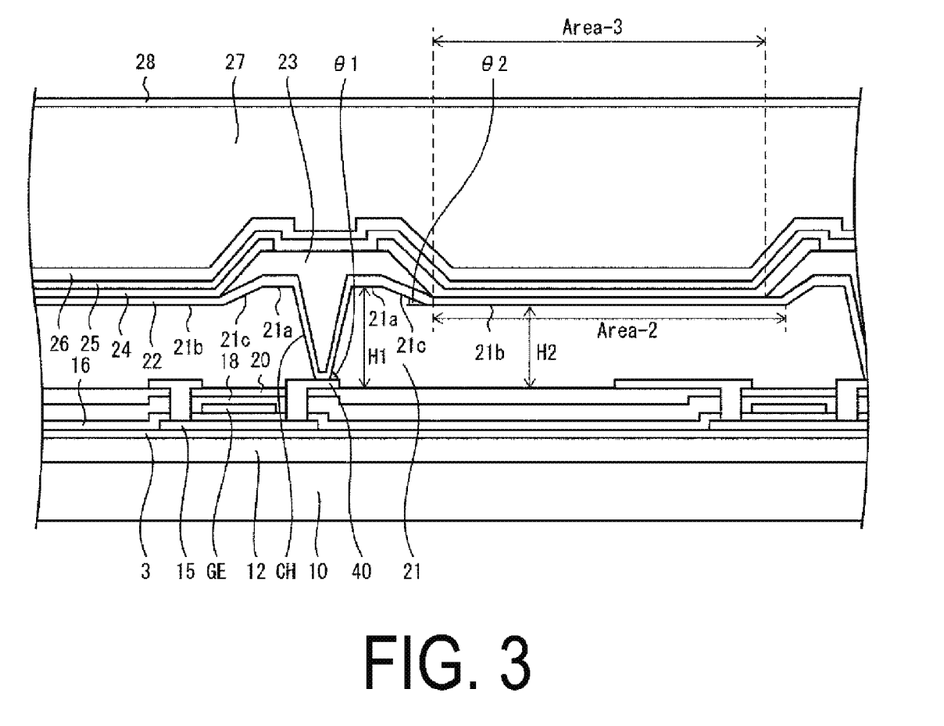
FIG. 3 is a cross-sectional view taken along A-A' in FIG. 4.

FIG. 3 is a cross-sectional view taken along A-A' in FIG. 4 (described later). As illustrated, the flattening film 21 includes a first planar portion 21a having a first film thickness H1 and a second planar portion 21b having a second film thickness H2. The first film thickness H1 is greater than the second film thickness H2.

A contact hole CH is formed in the first planar portion 21a. The anode 22 and the third metal layer (drain electrode 40 in FIG. 3) are electrically connected via the contact hole CH formed in the first planar portion 21a. The drain electrode 40 is an example of a metal layer, and may be a source electrode (not illustrated) or the like. θ1 in the drawing indicates an angle of a wall surface of the contact hole CH relative to a front face of the third metal layer (drain electrode 40 in FIG. 3).

A front face of the second planar portion 21b is formed flat or substantially flat. A plurality of transistors and/or a plurality of source wiring lines or the like are formed in the lower layer of the second planar portion 21b. In a known display device, unevenness is present in the flattening film due to the effect of the plurality of source wiring lines or the like. Nevertheless, the front face of the second planar portion 21b is formed flat or substantially flat.

The flattening film 21 further includes an inclined portion 21c. The inclined portion 21c is formed between the first planar portion 21a and the second planar portion 21b having different film thicknesses. Therefore, a front face of the inclined portion 21c is inclined relative to a front face of the first planar portion 21a or the front face of the second planar portion 21b. θ2 in the drawing indicates an inclination angle of the front face of the inclined portion 21c relative to the front face of the second planar portion 21b. Note that θ1>θ2.

Method of Preparing Flattening Film 21

Next, a method of preparing the flattening film 21 will be described. As described above, the inorganic insulating film 20 is formed of a silicon oxide (SiOx) film or a silicon nitride (SiNx) film, or a layered film of these, formed using CVD, for example. Then, the third metal layer is formed and patterned to form the source wiring line SH.

Then, a coatable photosensitive resin (flattening resin) such as a polyimide, an acrylic, or the like, for example, is applied to form the flattening film 21. Subsequently, the photosensitive resin layer is exposed all at once using a graytone mask or halftone mask 70 ("all at once" meaning formed using two masks without being exposed twice) to form the flattening film 21.

Figure 5:
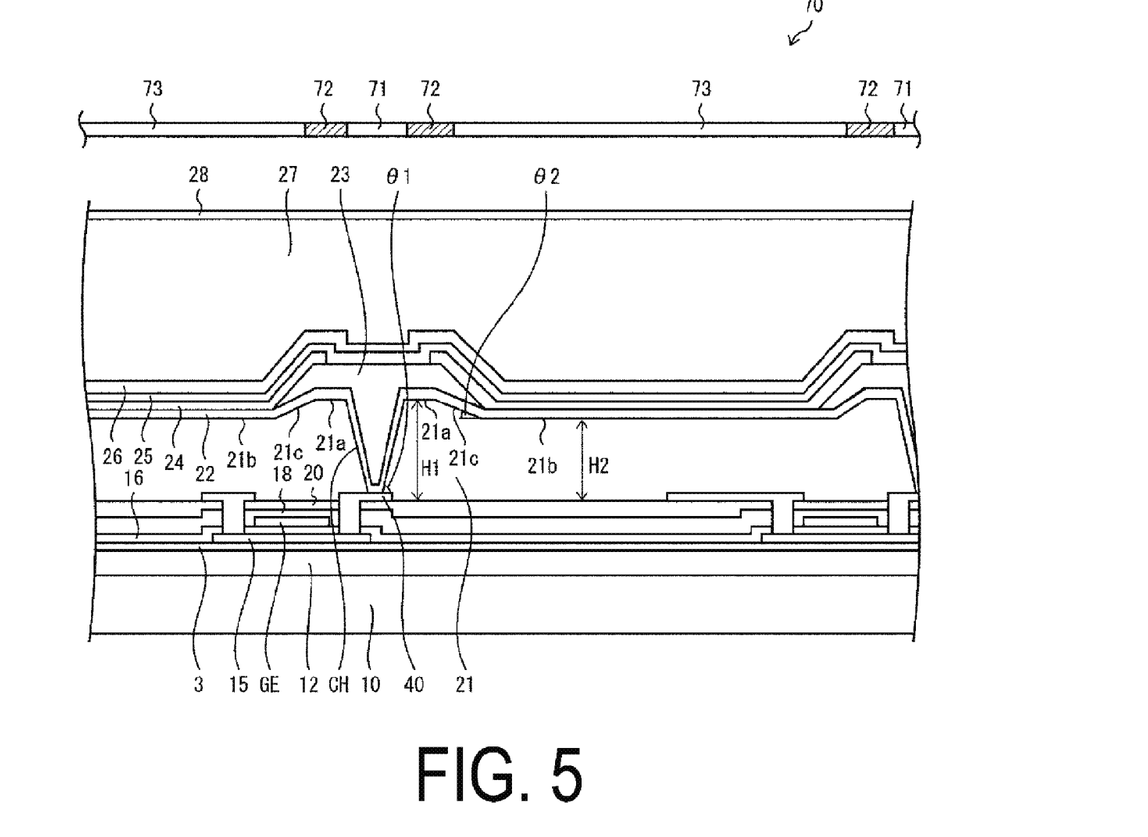
FIG. 5 is a drawing for describing a method of using a graytone mask or a halftone mask to form a flattening film.

Next, a method of forming the flattening film 21 will be described with reference to FIG. 5. FIG. 5 is a drawing for describing a method of forming the flattening film 21 using the graytone mask or halftone mask 70.

As illustrated, the graytone mask or halftone mask 70 includes a light-transmitting portion 71 that transmits light, a light-blocking portion 72 that blocks light, and a semi-light-transmitting portion 73 having a light transmittance (30%, for example) between those of the light-transmitting portion 71 and the light-blocking portion 72.

Specifically, a region where the contact hole CH requiring high taper is formed is exposed. As a result, the contact hole CH is formed, exposing the third metal layer (drain electrode 40).

A peripheral region of the contact hole CH is not exposed. As a result, in the peripheral region of the contact hole CH, a film thickness of the flattening film 21 is maintained before and after exposure. This region becomes the first planar portion 21a.

The light-emitting region (opening of the edge cover) requiring flatness is the second planar portion 21b obtained by exposing and developing, by the semi-light-transmitting portion 73, the photosensitive resin layer. The semi-light-transmitting portion 73 corresponds to the second planar portion 21b. The film thickness (second film thickness H2) of the second planar portion 21b is smaller than that of the first planar portion 21a. The flattening film 21 thus slightly exposed is smoothened, with protruding portions being shaved away, thereby leveling the front face. In other words, the unevenness of mainly the region of the flattening film 21 corresponding to the opening of the edge cover 23 is leveled and, as a result, the flatness of the display region is improved.

At a boundary between the first planar portion 21a and the second planar portion 21b, an inclination arises due to a difference in an amount of exposure of the light-blocking portion 72 (0%) and the semi-light-transmitting portion 73 (30%, for example). This portion is the inclined portion 21c.

The first planar portion 21a, the second planar portion 21b, and the inclined portion 21c can be prepared by two or more exposure processes (photolithography processes), but preparation by one exposure process is preferred from the perspective of reducing man-hours and reducing costs. The exposure process may be a positive type or a negative type.

Note that, here, a configuration has been described in which the flattening film 21 is formed from a photosensitive resin. However, a configuration can be adopted in which a resist is applied to a flattening resin, not a photosensitive resin, and the resist is exposed and developed all at once using the graytone mask or halftone mask 70 to form the flattening film 21.

After formation of the flattening film 21, annealing is performed. Due to a heat slump from the annealing process, the front face of the second planar portion 21b promotes further flattening. Specifically, even if some unevenness remains on the front face of the second planar portion 21b, the heat from the annealing process causes the material constituting the protruding portions to flow toward recessed portions. As a result, the front face of the second planar portion 21b is further flattened.

Furthermore, due to the heat slump described above, the inclination angle of the front face of the inclined portion 21c relative to the front face of the second planar portion 21b becomes smaller, resulting in θ2. As a result, a difference in height between the first planar portion 21a and the second planar portion 21b is suppressed, and thinning of the flattening film 21 in its entirety can be promoted. In this way, a flatness of the flattening film 21 is further enhanced by a synergistic effect of the slight exposure process and the annealing process. Further, as the thinning of the flattening film 21, in its entirety, progresses, the mounting of the layered body onto the display device 2 becomes easier.

Further, to make the contact hole CH as small as possible and widen an effective pixel area, the taper of the contact hole CH needs to be high. To form the contact hole CH having a high taper, the light-transmitting portion 71 and the light-blocking portion 72 are used to expose and develop the contact hole CH. The light-transmitting portion 71 corresponds to the contact hole CH, and the light-blocking portion 72 corresponds to the first planar portion 21a. Then, the angle of the wall surface of the contact hole CH relative to the front face of the third metal layer becomes θ1 by the annealing process. At this time, θ1>θ2, and the high taper of the contact hole CH and the thinning of the flattening film 21, in its entirety, can be achieved simultaneously.

In a known display device, the flattening film has unevenness on the front face due to an effect of the plurality of source wiring lines or the like formed in the lower layer. The anode is formed on the flattening film having unevenness, and thus the problem arises that the effect of the unevenness causes the reflected light to not be reflected in a straight manner in the light-emitting region.

In this regard, in the display device 2 according to the present embodiment, the flattening film 21 is flat or substantially flat, and thus the unevenness below the anode 22 is also reduced. As a result, the light reflectivity of the anode 22 is improved, and the display device 2 can increase in luminous efficiency.

Note that the method of forming the anode 22 and the like in an upper layer overlying the flattening film 21 is as described above, and thus description thereof will be omitted.

When Opening of Edge Cover 23 Overlaps Second Planar Portion 21b

Figure 4:
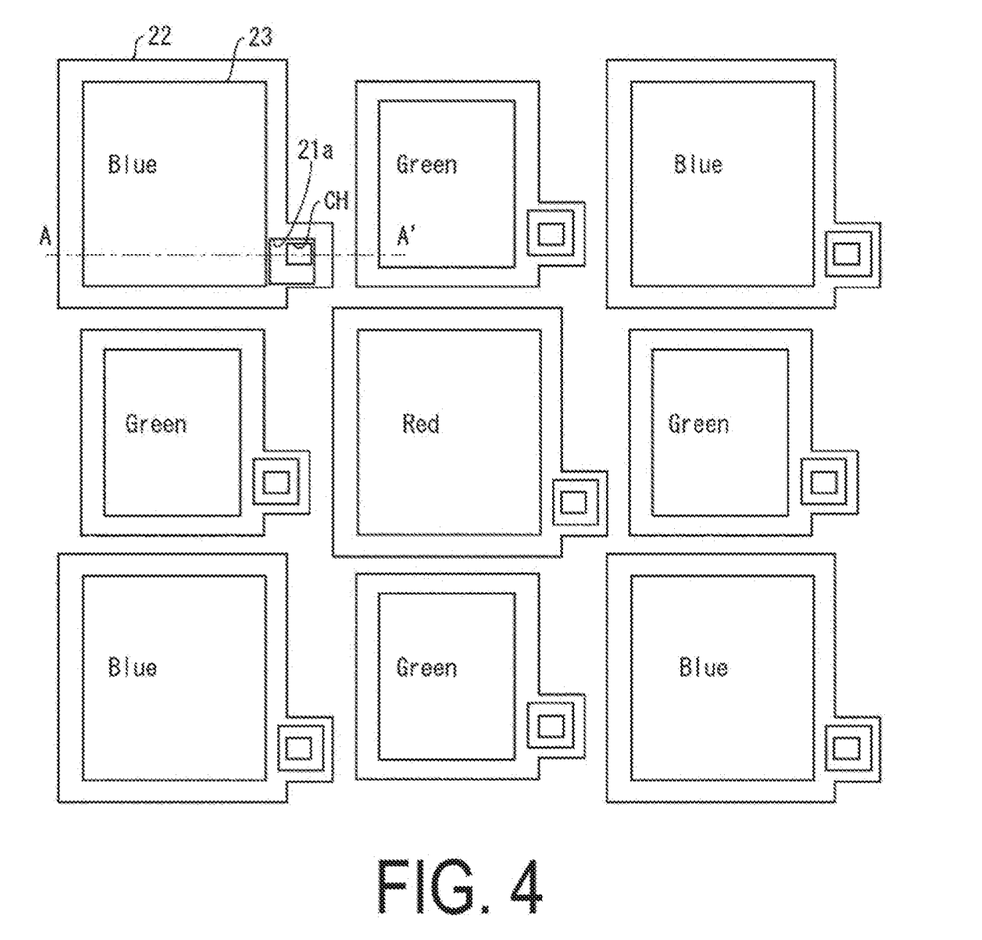
FIG. 4 is a top view of the display device according to the present embodiment.

FIG. 4 is a top view of the display device 2. As illustrated, the edge cover 23 is provided correspondingly to each of the plurality of subpixels. The edge cover 23 covers the edge of the anode 22 and includes an opening formed therein, exposing the anode 22. The first planar portion 21a is formed outside the opening of the edge cover 23. As illustrated, the contact hole CH is formed in the first planar portion 21a. In FIG. 4, the opening, in its entirety, of the edge cover 23 overlaps the second planar portion 21b. As a result, the flattening film 21 in the light-emitting region (opening of the edge cover) is formed by the second planar portion 21b, resulting in a smooth light-emitting region with little unevenness.

More specifically, in FIG. 3, a region corresponding to the second planar portion 21b is denoted by "Area-2", and a region corresponding to the opening (light-emitting region) of the edge cover 23 is denoted by "Area-3". As illustrated in FIG. 3 and FIG. 4, the Area-3, in its entirety, overlaps the Area-2". That is, the opening, in its entirety, of the edge cover 23 overlaps the second planar portion 21b. On the basis of such a configuration, the first planar portion 21a and the second planar portion 21b can be formed.

When Opening of Edge Cover 23 Overlaps First Planar Portion 21a

Next, another configuration of the first planar portion 21a and the second planar portion 21b will be described using FIG. 6 and FIG. 7.

Figure 6:
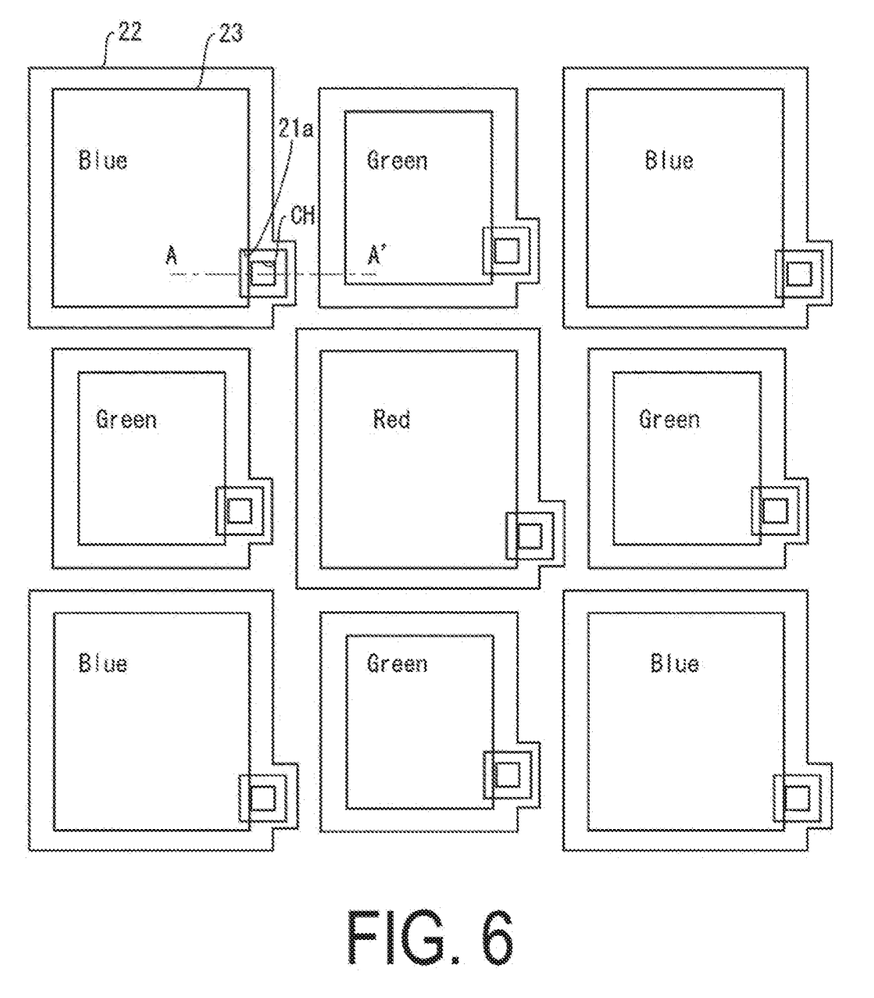
FIG. 6 is a top view of the display device according to another embodiment.

FIG. 6 is a top view of the display device according to the other embodiment. As illustrated, the edge cover 23 is provided correspondingly to each of the plurality of subpixels. The edge cover 23 covers the edge of the anode 22 and includes an opening exposing the anode 22. In FIG. 6, the first planar portion 21a is formed overlapping the opening of the edge cover 23. The specific configuration is described using FIG. 7.

Figure 7:
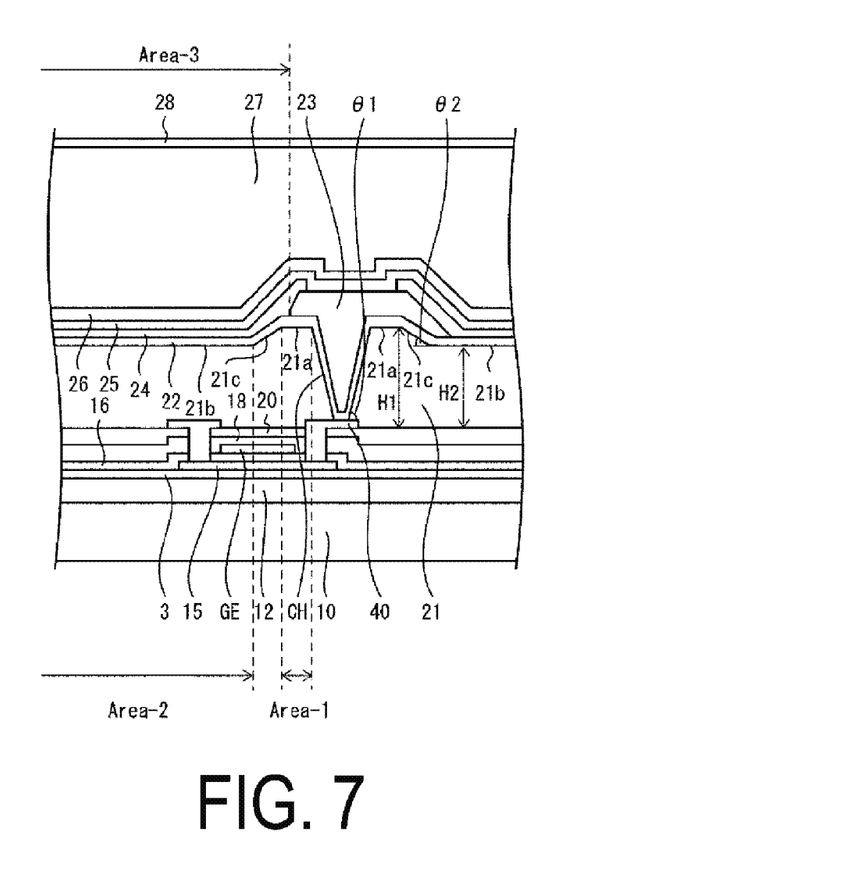
FIG. 7 is a cross-sectional view taken along A-A' in FIG. 6.

FIG. 7 is a cross-sectional view taken along A-A' in FIG. 6. In FIG. 7, a region corresponding to the first planar portion 21a is denoted by "Area-1". A region corresponding to the second planar portion 21b is denoted by "Area-2". A region corresponding to the opening of the edge cover 23 is denoted by "Area-3".

As illustrated in FIG. 6 and FIG. 7, a portion of a boundary between the Area-1 and the Area-2 overlaps the Area-3. That is, a portion of the boundary between the first planar portion 21a and the second planar portion 21b overlaps the opening of the edge cover 23. Further, as illustrated in FIG. 6 and FIG. 7, the Area-1 and the Area-3 overlap. That is, a portion of the first planar portion 21a overlaps the opening of the edge cover 23. On the basis of such a configuration as well, the first planar portion 21a and the second planar portion 21b can be formed.

According to this configuration, the contact hole region can be effectively utilized and, as a result, the display pixel can be made to have an even higher resolution.

Configuration of Terminal Portion

As described above, an electronic circuit board is mounted onto a terminal portion TM for inputting a signal from an external source, the terminal portion TM being a portion (non-display region, frame) outside of the display region in which the plurality of subpixels are formed. Here, a configuration is considered in which (1) the second planar portion 21b extends to the non-display region, (2) an opening (second opening) is formed in the second planar portion 21b in the non-display region, and (3) the terminal portion TM formed in the non-display region is exposed by the opening.

Figure 8:
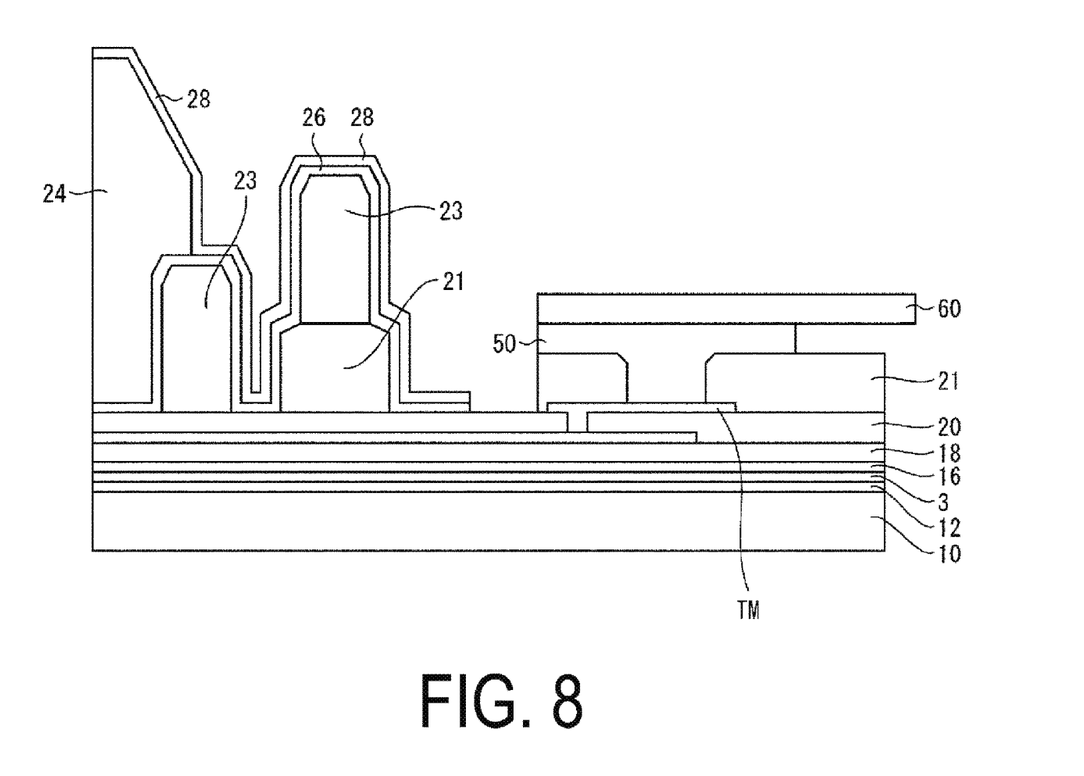
FIG. 8 is a cross-sectional view illustrating a terminal portion electrically connected, via an anisotropic conductive resin layer, to a flexible printed circuit board.

FIG. 8 is a cross-sectional view illustrating the terminal portion TM electrically connected, via an anisotropic conductive resin layer 50, to a flexible printed circuit board 60, in this configuration. For the sake of simplicity, members having the same functions as the members described in the foregoing embodiment will be given the same reference signs, and descriptions thereof will be omitted.

A terminal conductive film formed of a same material and in a same layer as the third metal layer is formed in the terminal portion TM. The terminal conductive film is covered, at an edge thereof, by the second planar portion 21b, is exposed by the opening formed in the second planar portion 21b, and is electrically connected, via the anisotropic conductive resin 50, to a terminal of the flexible printed circuit board 60.

In this way, the second planar portion 21b is formed in the terminal portion TM as well, the second planar portion is thinner than the first planar portion, and the second planar portion is formed in the terminal portion TM, making it possible to reduce mounting failure. Such a configuration is also included in the present embodiment.

Application

An electro-optical element (an electro-optical element having luminance and transmittance controlled by an electric current) provided in a display device according to the present embodiment is not particularly limited thereto. Examples of the display device according to the present embodiment include an organic electroluminescent (EL) display provided with the organic light-emitting diode (OLED) as the electro-optical element, an inorganic EL display provided with an inorganic light-emitting diode as the electro-optical element, a quantum dot light-emitting diode (QLED) display provided with a QLED as the electro-optical element, and the like.

Supplement

A display device according to a first aspect of the present invention includes a base substrate, an inorganic insulating layer, a metal layer, a flattening film, a first electrode, an edge cover, a function layer, and a second electrode. The inorganic insulating layer, the metal layer, the flattening film, the first electrode, the edge cover, the function layer, and the second electrode are formed, in that order, on the base substrate. The edge cover covers an edge of the first electrode and includes a first opening exposing the first electrode. The function layer is formed covering the first opening and an edge of the edge cover. The flattening film includes a first planar portion and a second planar portion having a film thickness smaller than that of the first planar portion, is configured to electrically connect the first electrode and the metal layer via a contact hole formed in the first planar portion, and overlaps the first opening at at least a portion of the second planar portion.

According to the configuration described above, a reflected light reflected by the first electrode formed in the second planar portion is readily reflected in a straight manner. With the second planar portion overlapping, at at least a portion thereof, the first opening, it is possible to realize a display device having a luminous efficiency higher than that in the past.

The display device according to a second aspect of the disclosure may adopt a configuration in which, in the first aspect described above, the contact hole has a taper greater than a taper at a boundary between the first planar portion and the second planar portion.

According to the configuration described above, it is possible to promote the thinning of the flattening film.

The display device according to a third aspect of the disclosure may adopt a configuration in which, in the first or second aspect described above, the first opening overlaps, in its entirety, the second planar portion.

The display device according to a fourth aspect of the disclosure may adopt a configuration in which, in the first or the second aspect described above, a portion of the boundary between the first planar portion and the second planar portion overlaps the first opening.

According to the configuration described above, the contact hole region can be effectively utilized and, as a result, the display pixel can be made to have an even higher resolution.

The display device according to a fifth aspect of the disclosure may adopt a configuration in which, in the first or second aspect described above, a portion of the first planar portion and the first opening overlap.

According to the configuration described above, the contact hole region can be effectively utilized and, as a result, the display pixel can be made to have an even higher resolution.

The display device according to a sixth aspect of the disclosure may adopt a configuration in which, in any one of the first to fifth aspects described above, the display device further includes a terminal portion configured to input a signal from an external source to an edge of the display device, a terminal conductive film formed in the terminal portion and formed of a same material and in a same layer as the metal layer, and a second opening formed in the second planar portion. The terminal conductive film is configured to be covered, at an edge thereof, by the second planar portion, exposed by the second opening, and electrically connected to a terminal of a flexible printed circuit board via an anisotropic conductive resin.

According to the configuration described above, the second planar portion is thinner than the first planar portion and the second planar portion is formed on the terminal portion, making it possible to reduce mounting failure.

A method for manufacturing a display device according to a seventh aspect of the disclosure is a method for manufacturing a display device including a base substrate, an inorganic insulating layer, a metal layer, a flattening film, a first electrode, an edge cover, a function layer, and a second electrode, the inorganic insulating layer, the metal layer, the flattening film, the first electrode, the edge cover, the function layer, and the second electrode being formed, in that order, on the base substrate, the edge cover covering an edge of the first electrode and including a first opening exposing the first electrode, and the function layer being formed covering the first opening and an edge of the edge cover. The method includes the steps of forming the flattening film, applying a flattening resin onto the inorganic insulating layer and an upper layer of the metal layer, and using a graytone mask or a halftone mask to form a first planar portion including a contact hole configured to expose, all at once, the flattening resin and expose the metal layer, and a second planar portion having a film thickness smaller than that of the first planar portion and overlapping, at at least a portion thereof, the first opening.

The method for manufacturing a display device according to an eighth aspect of the disclosure may adopt a configuration in which, in the seventh aspect described above, the graytone mask or the halftone mask includes a light-transmitting portion configured to transmit light, a light-blocking portion configured to block light, and a semi-light-transmitting portion having a light transmittance between those of the light-blocking portion and the light-transmitting portion. The light-blocking portion, the semi-light-transmitting portion, and the light-transmitting portion correspond to the first planar portion, the second planar portion, and the contact hole, respectively.

The method for manufacturing a display device according to a ninth aspect of the disclosure may adopt a configuration in which, in the eighth aspect described above, the display device further includes a terminal portion configured to input a signal from an external source to an edge of the display device, and a terminal conductive film formed on the terminal portion and formed in a same layer and of a same material as the metal layer. The forming of the flattening film includes exposing, by the semi-light-transmitting portion and the light-transmitting portion, the flattening resin applied to the terminal portion, thereby forming the second planar portion covering an edge of the terminal conductive film and a second opening exposing the terminal conductive film, respectively.

The disclosure is not limited to each of the embodiments described above, and various modifications may be made within the scope of the claims. Embodiments obtained by appropriately combining technical approaches disclosed in each of the different embodiments also fall within the technical scope of the disclosure.

REFERENCE SIGNS LIST

2 Display device
3 Barrier layer
5 Light-emitting element layer
6 Sealing layer
10 Lower face film
12 Resin layer
15 Semiconductor layer
16, 18, 20 Inorganic insulating film
21 Flattening film
21a First planar portion
21b Second planar portion
21c Inclined portion
22 Anode
23 Edge cover
25 Cathode
26, 28 Inorganic sealing film
27 Organic buffer film
39 Function film
40 Drain electrode
50 Anisotropic conductive resin layer
60 Flexible printed circuit board
70 Graytone mask or halftone mask
71 Light-transmitting portion
72 Light-blocking portion
73 Semi-light-transmitting portion

The invention claimed is:

1. A display device comprising:
a base substrate;
an inorganic insulating layer;
a metal layer;
a flattening film;
a first electrode;
an edge cover;
a function layer; and
a second electrode,
wherein the inorganic insulating layer, the metal layer, the flattening film, the first electrode, the edge cover, the function layer, and the second electrode are formed, in that order, on the base substrate,
the edge cover covers an edge of the first electrode and includes a first opening exposing the first electrode,
the function layer is formed covering the first opening and an edge of the edge cover,
the flattening film includes a first planar portion and a second planar portion having a film thickness smaller than that of the first planar portion, is configured to electrically connect the first electrode and the metal layer via a contact hole formed in the first planar portion, and
a portion of a boundary between the first planar portion and the second planar portion overlaps the first opening.

2. The display device according to claim 1, further comprising:
a terminal portion configured to input a signal from an external source to an edge of the display device;
a terminal conductive film formed in the terminal portion and formed of a same material and in a same layer as the metal layer; and
a second opening formed in the second planar portion,
wherein the terminal conductive film is configured to be covered, at an edge thereof, by the second planar portion, exposed by the second opening, and electrically connected to a terminal of a flexible printed circuit board via an anisotropic conductive resin.

* * * * *